(12) United States Patent
Zheng et al.

(10) Patent No.: US 8,022,351 B2
(45) Date of Patent: Sep. 20, 2011

(54) SINGLE PHOTON DETECTION WITH SELF-QUENCHING MULTIPLICATION

(75) Inventors: Xinyu Zheng, Monterey Park, CA (US); Thomas J. Cunningham, Pasadena, CA (US); Bedabrata Pain, Los Angeles, CA (US)

(73) Assignee: California Institute of Technology, Pasadena, CA (US)

( * ) Notice: Subject to any disclaimer, the term of this patent is extended or adjusted under 35 U.S.C. 154(b) by 196 days.

(21) Appl. No.: 12/370,066

(22) Filed: Feb. 12, 2009

(65) Prior Publication Data

US 2009/0309648 A1 Dec. 17, 2009

Related U.S. Application Data

(60) Provisional application No. 61/065,696, filed on Feb. 14, 2008.

(51) Int. Cl.
*H01J 43/04* (2006.01)
*H01J 43/08* (2006.01)

(52) U.S. Cl. ............ 250/214.1; 257/186; 257/438

(58) Field of Classification Search .......... 250/214.1; 257/186, 199, 438, 603
See application file for complete search history.

(56) References Cited

U.S. PATENT DOCUMENTS

| | | | | |
|---|---|---|---|---|
| 4,383,269 A * | 5/1983 | Capasso | ........... | 257/186 |
| 4,586,067 A * | 4/1986 | Webb | ........... | 257/438 |
| 4,586,068 A * | 4/1986 | Petroff et al. | ........... | 257/438 |
| 4,982,255 A * | 1/1991 | Tomita | ........... | 257/21 |
| 5,075,750 A * | 12/1991 | Kagawa | ........... | 257/438 |
| 5,432,361 A * | 7/1995 | Taguchi | ........... | 257/186 |
| 5,471,068 A * | 11/1995 | Tsuji et al. | ........... | 257/21 |
| 5,541,426 A * | 7/1996 | Abe et al. | ........... | 257/170 |
| 6,104,047 A * | 8/2000 | Watanabe | ........... | 257/186 |
| 6,380,572 B1 * | 4/2002 | Pain et al. | ........... | 257/292 |
| 6,417,528 B1 * | 7/2002 | Bond | ........... | 257/186 |
| 6,720,588 B2 * | 4/2004 | Vickers | ........... | 257/186 |
| 6,838,301 B2 * | 1/2005 | Zheng et al. | ........... | 438/48 |
| 6,946,369 B2 | 9/2005 | Mazen et al. | | |
| 7,049,640 B2 * | 5/2006 | Boisvert et al. | ........... | 257/186 |
| 7,187,013 B2 * | 3/2007 | Nakaji et al. | ........... | 257/186 |
| 7,202,102 B2 * | 4/2007 | Yao | ........... | 438/69 |
| 7,294,519 B2 | 11/2007 | Lee et al. | | |
| 7,345,325 B2 * | 3/2008 | Nakaji et al. | ........... | 257/186 |
| 7,557,387 B2 * | 7/2009 | Ishibashi et al. | ........... | 257/186 |
| 7,714,292 B2 * | 5/2010 | Agarwal et al. | ........... | 250/370.01 |
| 7,741,657 B2 * | 6/2010 | Pauchard et al. | ........... | 257/186 |
| 7,829,915 B2 * | 11/2010 | Shi et al. | ........... | 257/186 |
| 2002/0121655 A1 * | 9/2002 | Zheng et al. | ........... | 257/291 |

(Continued)

OTHER PUBLICATIONS

Hayat et al., "Statistics of Self-quenching Time in Single Photon Avalanche Diodes", IEEE Laser and Electro-Optics Society, 2008, LEOS 2008 21$^{st}$ Annual Meeting of the, pp. 230-231, 2008.

(Continued)

*Primary Examiner* — John Lee
(74) *Attorney, Agent, or Firm* — Steinfl & Bruno LLP

(57) ABSTRACT

A photoelectronic device and an avalanche self-quenching process for a photoelectronic device are described. The photoelectronic device comprises a nanoscale semiconductor multiplication region and a nanoscale doped semiconductor quenching structure including a depletion region and an undepletion region. The photoelectronic device can act as a single photon detector or a single carrier multiplier. The avalanche self-quenching process allows electrical field reduction in the multiplication region by movement of the multiplication carriers, thus quenching the avalanche.

20 Claims, 7 Drawing Sheets

U.S. PATENT DOCUMENTS

| | | | | |
|---|---|---|---|---|
| 2002/0195616 | A1* | 12/2002 | Bond | 257/186 |
| 2003/0098463 | A1* | 5/2003 | Vickers | 257/186 |
| 2003/0178636 | A1* | 9/2003 | Kwan et al. | 257/186 |
| 2005/0156192 | A1* | 7/2005 | Ko et al. | 257/186 |
| 2006/0017129 | A1* | 1/2006 | Nakaji et al. | 257/438 |
| 2006/0115916 | A1 | 6/2006 | Lee et al. | |
| 2007/0090397 | A1* | 4/2007 | Nakata et al. | 257/186 |
| 2007/0200141 | A1* | 8/2007 | Ishibashi et al. | 257/186 |
| 2008/0121866 | A1* | 5/2008 | Yuan et al. | 257/14 |
| 2009/0050933 | A1* | 2/2009 | Shiba et al. | 257/186 |
| 2009/0152681 | A1* | 6/2009 | Zheng et al. | 257/603 |
| 2009/0309648 | A1* | 12/2009 | Zheng et al. | 327/514 |
| 2010/0314531 | A1* | 12/2010 | Menge | 250/214.1 |

OTHER PUBLICATIONS

Zappa et al., "Photon-Counting Chip for Avalanche Detectors", IEEE Photonics Technology Letters, vol. 17, No. 1, pp. 184-186, Jan. 2005.

Liu et al., "Reduce Afterpulsing of Single Photon Avalanche Diodes Using Passive Quenching With Active Reset", IEEE Journal of Quantum Electronics, vol. 44, No. 5, pp. 430-434, May 2008.

Mosconi et al., "A CMOS sensor based on single photon avalanche diode for fluorescence lifetime measurements", IMTC 2006—Instrumentation Measurement Technology Conference, pp. 416-419, Apr. 2006.

Dworsky et al., "Avalanche-Initiated Space-Charge Oscillations", IEEE Transactions on Electron Devices, vol. ED-20, No. 6, pp. 573-581, Jun. 1973.

Piemonte et al., "Characterization of the Prototypes of Silicon Photomultiplier Fabricated at ITC-irst", IEEE Transactions on Nuclear Science, vol. 54, No. 1, pp. 236-244, Feb. 2007.

Burr et al., "Scintillation Detection Using 3 mm × 3 mm Silicon Photomultipliers", IEEE Nuclear Science Symposium Conference Record, pp. 975-982, Nov. 2007.

Webb et al., "Multi-Element Reachthrough Avalanche Photodiodes", IEEE transactions of electron Devices, vol. ED-31, No. 9, pp. 1206-1212, Sep. 1984.

Lecrosnier et al., "Optimization of Avalanche Silicon Photodiodes: A new structure", pp. 595-597, 1975.

Zheng et al., "Modeling and Fabrication of a Nano-multiplication-region Avalanche Photodiode", NASA Science Technology Conference, Jun. 19-21, 2007.

Stapels, C., et al., Solid-State Photomultiplier in CMOS Technology for Gamma-Ray Detection and Imaging Applications. Nuclear Science Symposium Conference Record, vol. 5, 23-29, pp. 2775-2779 (2005).

PCT International Search Report for PCT/US2009/033876 filed on Feb. 2, 2009 in the name of California Institute of Technology.

PCT Written Opinion for PCT/US2009/033876 filed on Feb. 2, 2009 in the name of California Institute of Technology.

* cited by examiner

SINGLE PHOTON DETECTION WITH SELF-QUENCHING MULTIPLICATION

CROSS REFERENCE TO RELATED APPLICATIONS

The present application is related to and claims the benefit of copending and commonly assigned U.S. Patent Application No. 61/065,696, titled "Self-quenching Single Photon Detector with a Partially Depleted Quenching Layer in a Pillar Structure," filed on Feb. 14, 2008, the entire contents of which are incorporated herein by reference.

STATEMENT OF GOVERNMENT GRANT

The invention described herein was made in the performance of work under a NASA contract, and is subject to the provisions of Public Law 96-517 (35 USC 202) in which the Contractor has elected to retain title.

FIELD

The present disclosure relates to photon detection and multiplication. More in particular, it relates to single photon detection with self-quenching multiplication, such as apparatus and methods for single photon detection with self-quenching multiplication and pulse output.

BACKGROUND

The photomultiplier tube (PMT) has dominated the area of single photon counting and single photon detection for many years. While possessing the desired photon counting functionality, i.e., outputting an explicit pulse upon reception of one single photon, a PMT is substantially bulky because of its vacuum tube nature. Besides, wavelength coverage and quantum efficiency of a PMT are both low. These drawbacks, plus low counting rate, high voltage and limited lifetime, make it impossible or very difficult to employ a PMT in many advanced areas, such as high speed photon counting, photon counting imaging, large format and spatially resolved photon and article detection, and space missions.

Geiger mode avalanche photodiodes (GAPDs) have also been employed for single photon counting. However, two major drawbacks, i.e., low speed/low counting rate and a requirement for external quenching, have severely inhibited advanced applications using Geiger mode avalanche photodiodes.

In particular, afterpulsing is an effect that substantially restrains the photon counting rate of a GAPD. Afterpulsing refers to a series of avalanche events triggered by the carriers that were generated in previous avalanche events, captured by the traps located at the vicinity of the avalanche region and then liberated again by these traps. The probability for afterpulsing to occur after detection of a signal photon is correlated to the amount of the traps located in the high field region and also the excess voltage, i.e., the amount of the bias above the breakdown voltage.

The time period needed for the afterpulsing probability to drop to below an acceptable level, which is known as the deadtime of the photon counting detector, normally ranges between microseconds and milliseconds. In order to prevent the afterpulses from being erroneously counted, photon counting should be blocked for a duration, which is named as reset time, after detection of a signal photon.

The upper portion of FIG. 1 shows a sequence 102 of photons incident into a gated GAPD. The lower portion of FIG. 1 shows the photon counting output 104 as a consequence of the photon events counted 106. Since the afterpulsing effect has high probability to occur in a certain time period or deadtime 108 after detection of a photon 110, photon incidency events 112, 114, 116 during the deadtime period are blocked or gated from counting, see reset time 118. As a result, the repeating rate of the photon counting is restricted by the magnitude of the deadtime.

Low avalanche initiation probability (AIP), which is general in GAPDs, leads to low quantum efficiency because the effective quantum efficiency is the product of AIP and the inner quantum efficiency. Avalanche initiation probability refers to the probability of a photoelectron to trigger an avalanche event in a GAPD detector. High avalanche initiation probability needs ideally uniform junction and multiplication region in the GAPD. Any artifacts, which include edge effect, defects and junction curvature, will lead to an "early breakdown" at a specific location and hence significantly reduce the probability for photogenerated carriers at other locations to trigger avalanche events there, leading to low AIP. Moreover, a GAPD pixel in an imaging array will suffer from a more severe AIP problem because its structure has to compromise with the processing technology.

More importantly, a Geiger mode avalanche photodiode (GAPD) requires an external quenching circuit to stop each of the avalanche events occurred inside it for otherwise the device will be burned out by the avalanching current. Because a GAPD pixel will become inactive after capture of one photon and the operation to reset the inactive pixels through the external quenching circuits is slow, a GAPD imager cannot recognize a scene unless the photon flux is very low, Leading to a very low dynamic range.

Passive and active quenching are the two quenching techniques currently available. Their typical circuits are schematically illustrated in FIG. 2 and FIG. 3. As discussed below, passive quenching is intrinsically slow because of the RC effect originated from the required high value of the quenching resistor. On the other hand, in view of chip area and power consumption requirements, active quenching does not suit array applications.

In particular, FIG. 2 shows a traditional Geiger mode Avalanche photodiode (GAPD) 202 in series with a passive quenching resistor 204. Once an avalanche effect occurs in the GAPD device 202, the high value of the resistor 204 will lead to a drop of the voltage across the GAPD 202 to below its breakdown voltage, hence quenching the avalanche process. A possible value for resistor 204 is 100 kΩ. Such high value of the resistor 204 results in a slow quenching process and even slower reset process, as also illustrated by the output waveform 206.

FIG. 3 shows a GAPD 302 with an active quenching circuit 304. While high speed can be achieved with the help of the quenching circuit 304, additional power consumption and space (or chip area, in the case of integrated circuits) will be required to implement this measure. For this reason, active quenching does not suit a GAPD imaging array. To exclude an erroneous counting of pulses resulting from the afterpulsing effect, a gating function 306 is incorporated in the quenching circuit 304 to prevent photon counting for a certain period after a real photon count. This, however, means that the afterpulsing effect will degrade the speed performance of a GAPD, even in the presence of a high speed quenching circuit.

There have been efforts to construct a "solid-state photomultiplier" (Christopher Stapels et al. "Solid-State Photomultiplier in CMOS Technology for Gamma-Ray Detection and Imaging Applications" Nuclear Science Symposium Conference Record, 2005 IEEE Volume 5, 23-29 Oct. 2005 Page(s): 2775-2779). However, such photomultiplier is an integrated detector array with one traditional GAPD and one passive quenching resistor at each pixel.

So-called "reach-through" structures are also known in the art. FIG. 4 shows the structure (upper portion of the figure) and the electric field bias profiles at different levels (lower portion of the figure) of such reach-through structure. This structure has been widely used in various avalanche photodiodes built on different semiconductor materials.

By inserting a layer 404 of p type reach-through structure beneath a multiplication region 406 in a structure also comprising a cathode 408, an anode 410, and an absorption region 412, high field will be restricted in the multiplication region 406 sandwiched between the cathode 408 and the reach-through structure 404. This will eliminate the probability for an avalanche event to occur outside the multiplication region 406. As the bias increases, the reach-through structure 404 will be fully depleted first and then the depletion region will penetrate into the absorption region 412, followed by breakdown occurring in the multiplication region 406.

The term "nanoscale" is used throughout the present disclosure to describe the lateral structural feature of all the component parts of the device according to the present disclosure that are contained in a pillar structure. In order to reflect the specific dimensional feature of the detector, the implication of the term "nanoscale" through the present disclosure is a little bit different from its usual meaning. In particular, throughout the present disclosure the term "nanoscale" will refer to a dimension ranging from 1-2,000 nm, and a nano-pillar will mean a pillar structure with a "nanoscale" diameter.

SUMMARY

According to a first aspect, a photoelectronic device is provided, comprising: a nanoscale doped semiconductor cathode or anode receiving, during operation of the photoelectronic device, multiplied electrons or holes; an undoped or unintentionally doped nanoscale semiconductor multiplication region connected with the cathode or anode, the multiplication region hosting carrier avalanche and carrier self-quenching during operation of the device; and a nanoscale doped semiconductor quenching structure connected with the multiplication region, the quenching structure comprising a depletion region that undergoes depletion during operation of the device and an undepletion region that remains undepleted during operation of the device.

According to a second aspect, an avalanche and self-quenching process for a photoelectronic device is provided, comprising: providing a nanoscale multiplication region and a nanoscale quenching structure connected with the nanoscale multiplication region, the nanoscale quenching region comprising a depletion layer that undergoes depletion during the avalanche and self-quenching process and an undepletion layer that remains undepleted during the avalanche self-quenching process; and injecting a photoelectron or a photo-generated hole into the nanoscale multiplication region, whereby avalanche is initiated upon the injecting and pairs of free carriers are generated as a result of carrier multiplication, wherein: space charge initially contributed by the depletion layer of the nanoscale quenching region is modulated as multiplied carriers of one type move through the nanoscale quenching structure, and electrical field in the multiplication region is reduced as a result of the modulation, thus quenching the avalanche.

Further aspects of the present disclosure are shows in the specification, drawings and claims of the present application.

According to some embodiments of the present disclosure, the detector of the disclosure is provided with a PMT-like self-quenching ability, a very short deadtime due to significantly eliminated afterpulsing effect and high quantum efficiency enabled by several measures including a favorite structure and a high avalanche initiation probability. The dark current or dark count rate of the detector of this disclosure, though still being larger than that of a PMT, is significantly lower than that of a traditional GAPD.

The teachings of the present disclosure can be applied to the fields of high speed single photon detection and high repeating rate single photon counting (e.g., Gigahertz photon counting optical communication), and high speed and time resolved single photon detection (e.g., various spectrometers and spectroscopy with nanosecond time resolution, including laser Induced Breakdown Spectroscopy, Laser Induced Fluorescence Spectroscopy, Raman Spectroscopy, and interferometer). Other application can include photon counting imaging (e.g., gigabit camera with extra-high dynamic range and extra-high contrast), spatially resolved large area photon detection for high energy physics and medical applications (e.g. Positron Emission Tomography, large area scintillation detector array), and space applications where low voltage, low power, robustness, and compactness are of extreme importance.

DETAILED DESCRIPTION

Because of the quantum nature of a photon, single photon detection is the ultimate photon detection. A single photon usually generates a pairs of single carriers (one electron and one hole) in a detector. For this reason, single photon detection can also be deduced to detection of a single carrier. Noise of the readout electronics or amplifiers is the major challenge faced by single photon detection and single carrier detection because the noise is normally equivalent to tens or more electrons. Carrier multiplication can turn one carrier generated by one photon into a big signal comprising tens, hundreds, thousands or even more carriers. While the multiplied signal can be directly sense or count explicitly, the multiplication should introduce little noise on its own turn.

Figure 5:
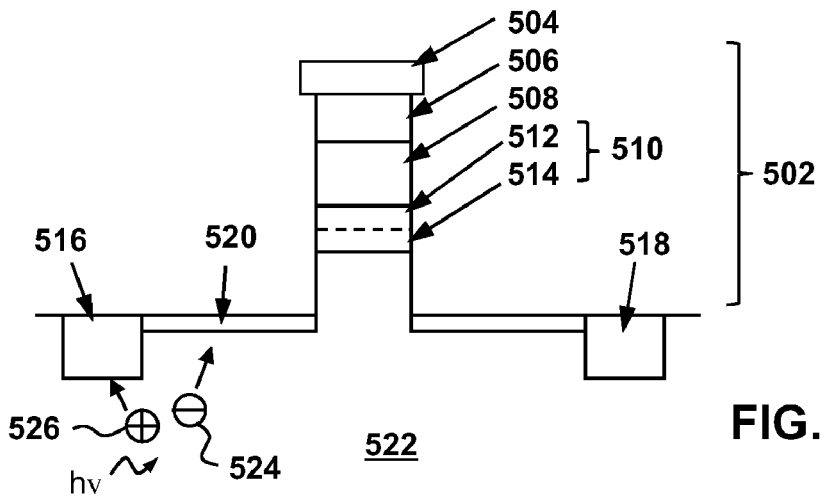
FIG. 5 shows a first embodiment of the device according to the present disclosure.

FIG. 5 shows a first embodiment of the present disclosure, where a self-quenching single photon detector 500 is represented. Self-quenching single photon detector 500 comprises a stacked doped structure 502 in a vertical pillar.

A nanoscale cathode contact 504 provides ohmic contact to a nanoscale cathode 506 and prevents invasion of metal elements into cathode 506. Cathode contact 504 can be a layer of amorphous or polycrystalline semiconductor having the same doping type as that of cathode 506. The thickness of cathode contact 504 can be, for example, in a 50-200 nm range. Cathode 506 is a $n^+$ type cathode, to which positive voltage will be applied during operation of the self-quenching single photon detector 500. The thickness of cathode 506 can be, for example, in a 50-200 nm range.

A $p^-$ type multiplication region 508 is an undoped or unintentionally doped layer between the cathode 506 and the later described quenching structure 510. During operation of the device, an avalanche process or a self-quenching process occur in multiplication region 508, as later explained. The thickness of multiplication region 508 can be, for example, in 100-500 nm range.

A quenching structure 510 comprises a p type upper portion 512 that will be depleted during operation of the self-quenching single photon detector 500 and a p type lower portion 514 that will stay undepleted during operation of the self-quenching single photon detector 500. The conditions under which a structure that is to be partially depleted during operation, can be obtained, can be later explained with reference to FIG. 10.

Figure 1:
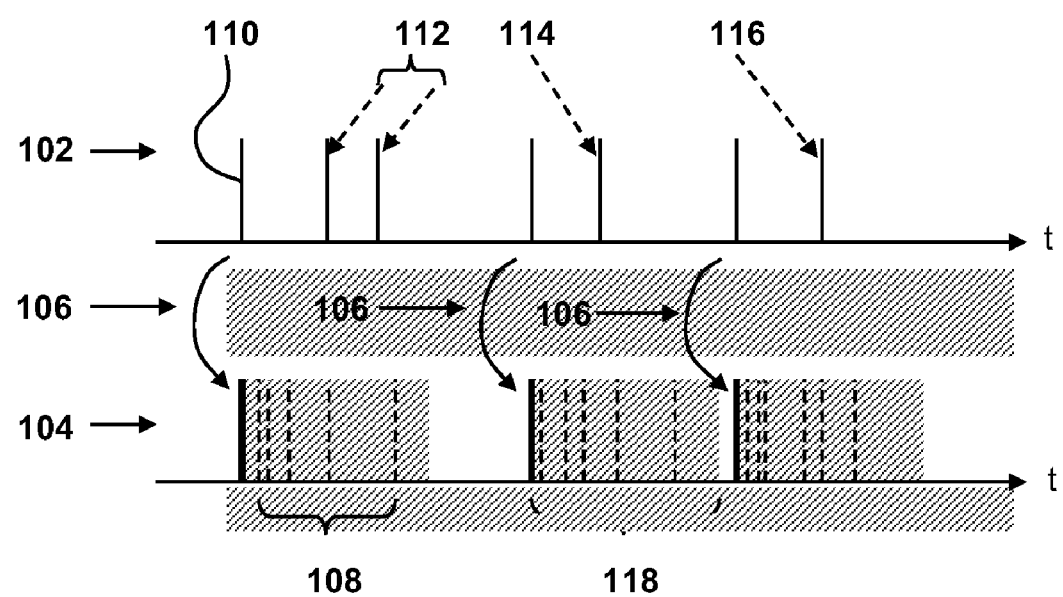
FIG. 1 shows a sequence of photons incident into a gated GAPD.
Figure 2:
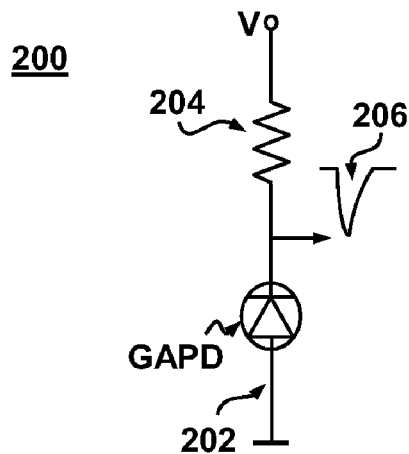
FIG. 2 shows a GAPD in series with a passive quenching resistor.
Figure 3:
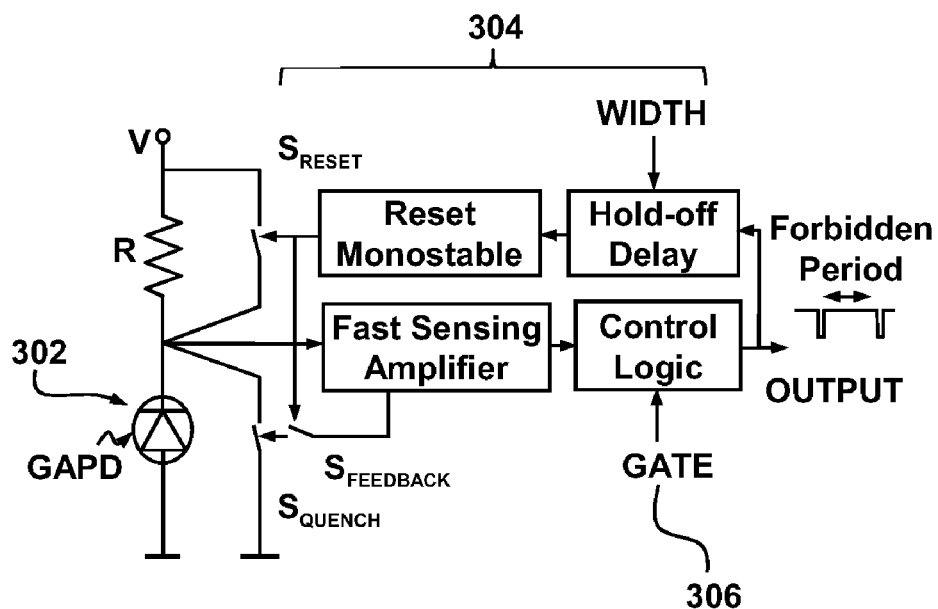
FIG. 3 shows a GAPD with an active quenching circuit.
Figure 4:
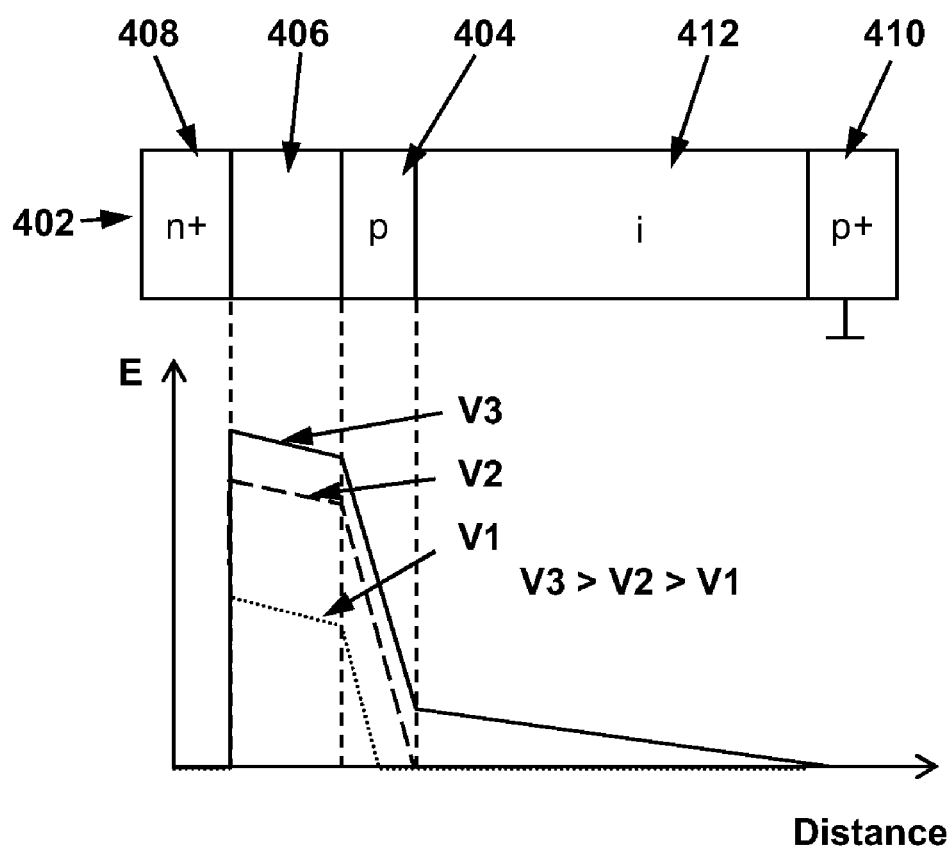
FIG. 4 shows s structure and electric field bias profiles at different levels of a reach-through structure.

Similar to the reach-through structure previously discussed with reference to FIG. 4, the depleted p type quenching structure 512 leads to concentration of high field in the multiplication region 508. As to the undepleted portion of the p type quenching structure 514, because of its presence, the quenching structure 510 is not fully depleted as the multiplication region 508 reaches the breakdown status or goes beyond it, as later explained in better detail with reference to FIG. 10.

The partial depletion of the quenching region 510 (i.e. the undepletion of layer 514) ensures that the multiplication region or layer 508 enters the status of breakdown at a very low voltage (e.g., 10V or below). Moreover, the undepleted layer 514 forms a shallow quantum or potential well for the holes. This retards the movement of the multiplied holes generated in an avalanche event on their way back to the anode 516, 518 and the positive space charge modulation thus formed will reduce the electrical field strength in the multiplication region down to below the critical value for breakdown. Therefore, the avalanche will be quenched.

The thickness of the quenching structure 510 comprised of depleted layer 512 and undepleted layer 514 can be, for example, between 100 and 500 nm.

The nanoscale diameter of the pillar is advantageous to the occurrence of the self-quenching effect because a large diameter may allow lateral spreading of the multiplied holes, hence weakening or even disabling the self-quenching effect. On the other hand, a nanoscale pillar structure 502 provides benefits that include significantly lowered dark current or dark count rate, virtual elimination of the afterpulsing effect, largely increased avalanche initiation probability and, most importantly, very high speed and very high photon counting rate. According to an embodiment of the present disclosure, the height of pillar structure 502 is, for example, between 300 nm and 1,500 nm and its diameter is, for example, between 10 nm and a couple of microns.

With continued reference to FIG. 5, the self-quenching single photon detector 500 comprises an n type floating cathode 520 formed on a shoulder region of the self-quenching single photon detector 500 to help development of depletion into an absorption region 522 and collection of photoelectrons from the absorption region 522. With the floating cathode 520, the lateral dimension of the detector can be extended up to a range between, for example, 100 and 1000 μm.

Region 522 is an i type or $p^-$ type absorption region, i.e. a low doping region for photons incident from the front or back side. The photoelectrons 524 will be collected to the floating cathode 520 and then guided to the pillar 502. On the other hand, the holes 526 photo-generated in the absorption region 522 will flow back to the anode 516, 518 together with the multiplied holes coming from the pillar 502.

Figure 6:
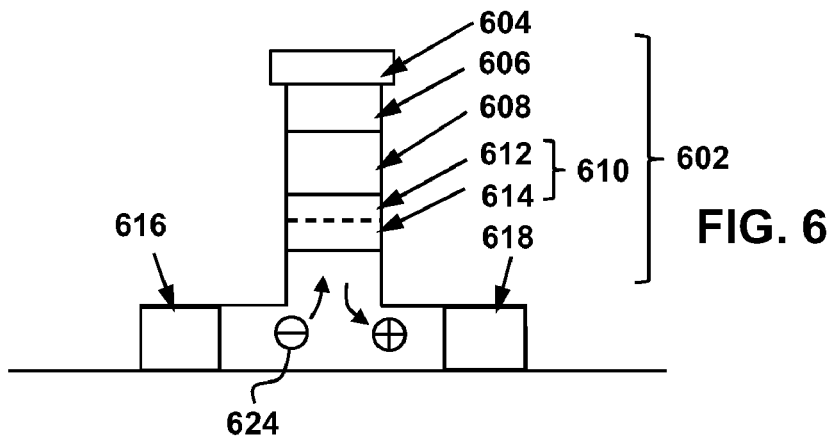
FIG. 6 shows a second embodiment of the device according to the present disclosure.

FIG. 6 shows a second embodiment of the present disclosure, where a self-quenching single electron multiplier 600 is shown. Such second embodiment is useful in situations where a carrier multiplication region cannot be easily built on the same material of the detector.

Similarly to the embodiment of FIG. 5, the embodiment of FIG. 6 shows a pillar 602 comprising a cathode contact 604, an $n^+$ type cathode 606, a $p^-$ type multiplication region 608, a p type quenching structure 610 which comprises, in turn, a depleted quench layer 612 and an undepleted quench layer 614.

Differently from the embodiment of FIG. 5, the embodiment of FIG. 6 does not absorb photons itself, but converts single electrons 624 from another detector into a pulse output of device 600. Therefore, device 600 does not contain an absorption region and contains instead an $n^+$ type contact 616 as an inlet for electrons coming from other detectors or devices. Device 600 also includes a $p^+$ type anode 618.

Therefore, as shown in FIG. 5 and FIG. 6, the doped structure 502/602 can serve either as a self quenching single photon detector 500 by combining structure 502 with a photon absorption region 522 to convert incident photons into outputted pulses, or as a self quenching single electron multiplier 600 to convert electrons collected from other detectors or devices into pulses. The single electron multiplier embodiment can be used in situations where the carrier multiplication region cannot be easily fabricated on the same material of the detector.

Although vertical pillars or vertically aligned structures have been described with reference to FIG. 5 and FIG. 6, the person skilled in the art will understand, upon reading of the above paragraphs, that also horizontally aligned (or differently aligned) doped structures can be provided. Moreover, although silicon can be the semiconductor material of choice, other semiconductor materials can also be used with the teachings of the present disclosure. Still further, inverted structures (where hole multiplication replaces electron multiplication) can be provided, with polarities opposite to those shown in FIG. 5 and FIG. 6.

Figure 7:
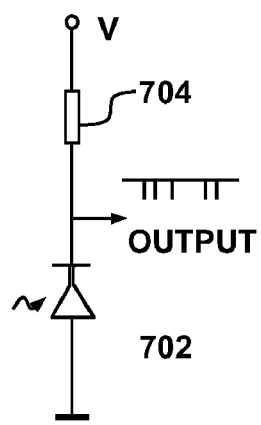
FIG. 7 shows a circuital diagram of the device of the first embodiment according to the present disclosure.

FIG. 7 is a circuital diagram 700 showing the detector 702 according to the present disclosure. The resistor 704 in series with detector 702 is inserted simply for sensing the pulse current passing through the detector 702 so its value can be very low if needed.

Figure 8:
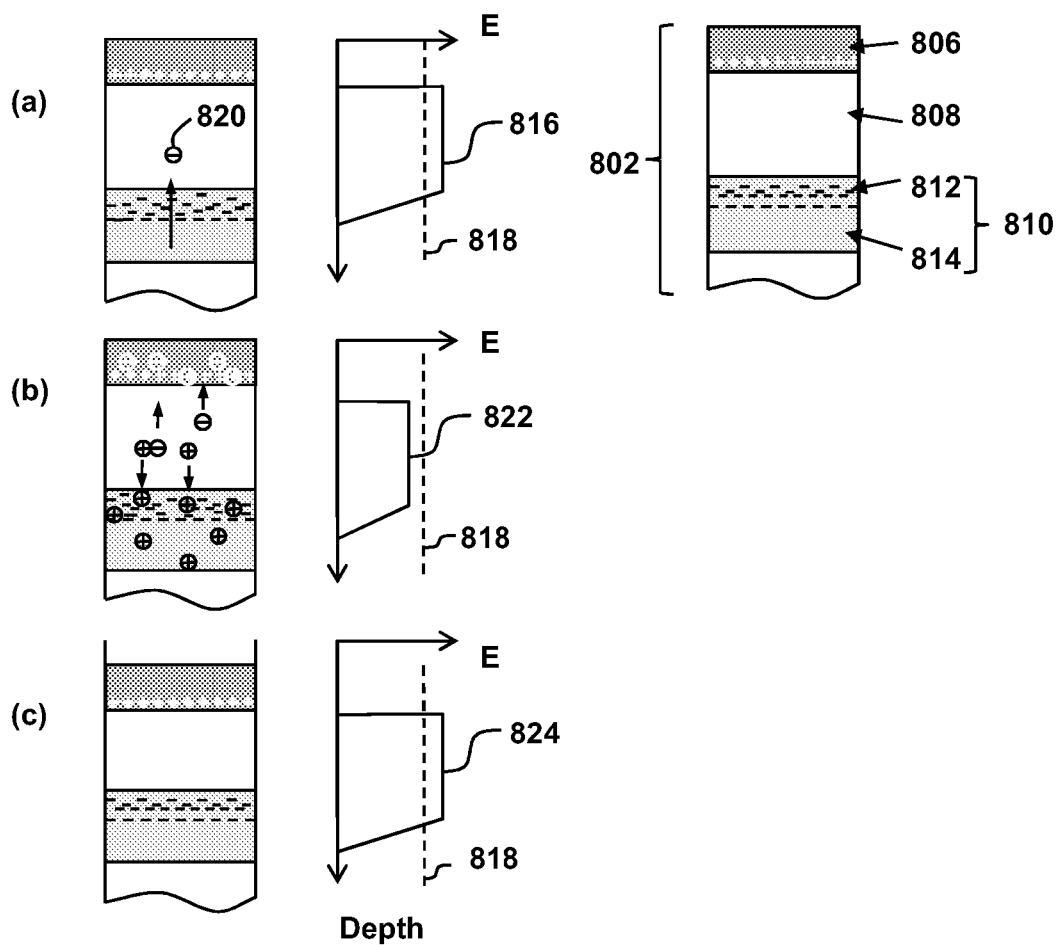
FIG. 8 is a multi-diagram figure showing the avalanche and self-quenching bi-process in the multiplication region of a device according to the present disclosure.

FIG. 8 is a multi-diagram figure showing the avalanche and self-quenching process in the multiplication region of a self-quenching single photon detector or a self-quenching single electron multiplier. The right portion of FIG. 8 is a schematic representation of a structure 802 comprising a cathode 806, a multiplication region 808, and a quenching structure 810 inclusive of a depleted layer 812 and an undepleted layer 814. Positive and negative space charges are represented with "+" and "−", respectively.

Insets (a), (b) and (c) of FIG. 8 show the changes occurring in the structure 802 during the avalanche and self-quenching processes, together with the values of the electric field E as a function of the depth of the structure.

As shown in inset (a), the field 816 in the multiplication region exceeds the critical value, indicated by dashed line 818, for occurrence of breakdown. Even with a field exceeding the limit, the breakdown does not occur until a photoelectron 820 injects into the multiplication region 808.

Turning now to inset (b), the avalanche initiated by the injection of photoelectron 820 is shown. Electrons and holes are generated as a result of carrier multiplication. Since the partially depleted quenching structure 810 forms a potential well for holes, the movement of the multiplied holes across the undepleted quenching region 814 is retarded, thus causing piling up of additional positive space charges in the quenching structure. The spontaneous space charge moderation thereafter caused leads to reduction of the multiplication field down to a value 822 below the critical value 818 for breakdown. Therefore, the avalanche is quenched because of the reduced field.

After sweeping out of the residual free carriers in the structure, the situation shown in inset (c) is now reached, where there are no more free electrons or holes in the multiplication region 808. Because of the elimination of the additional space charge, the field in the multiplication region 808 returns to a value 824 above the critical value 818, waiting for injection of the next photoelectron.

Therefore, as shown in FIG. 8 and described above, the partially depleted doped layer 810 beneath the multiplication region 808 plays an important role in the device according to the present disclosure. Because the field E in the multiplication region 808 is enclosed by the quenching structure 810, a low voltage (as low as 10V, as mentioned above) can lead to breakdown in the multiplication region 808, as discussed with reference to inset (b) of FIG. 8. On the other hand, the multiplied holes generated in an avalanche process have to flow across the quenching layer 810 (downward direction in the representation of FIG. 8) on their way back to the anode (see, e.g., anodes 516, 518 of FIG. 5). Presence of these holes in the quenching layer 810 will lead to the spontaneous reduction of the negative space charges intrinsically existing in the depleted portion 812 of the quenching layer 810. Compensation or feedback will be enhanced by two factors. First, the undepleted portion 814 of the quenching structure 810 forms a potential well which will retard movement of the multiplied holes. Secondly, the nanoscale dimension of the pillar structure 802 allows confinement of the multiplied holes and maximization of the feedback effect. As a result, the field in the multiplication region 808 will be reduced to a value below the critical value for breakdown, thus quenching the ongoing avalanche process.

With such an interaction between avalanche and self-quenching, the average voltage dropped across the multiplication region 808 will keep substantially constant. Except for a value that drops across the multiplication region 808, the excess voltage will drop across the absorption region (see, e.g., region 522 of FIG. 5), resulting in depletion there. Further increase of the bias will lead to occurrence of breakdown in the absorption region. According to an experimental verification made by applicants, the workable bias for a self-quenching single photon detector is between 10V and 40V. By way of comparison, a typical bias range for a GAPD is about 5V to 10V beyond a breakdown voltage of, typically, 100V.

Figure 9:
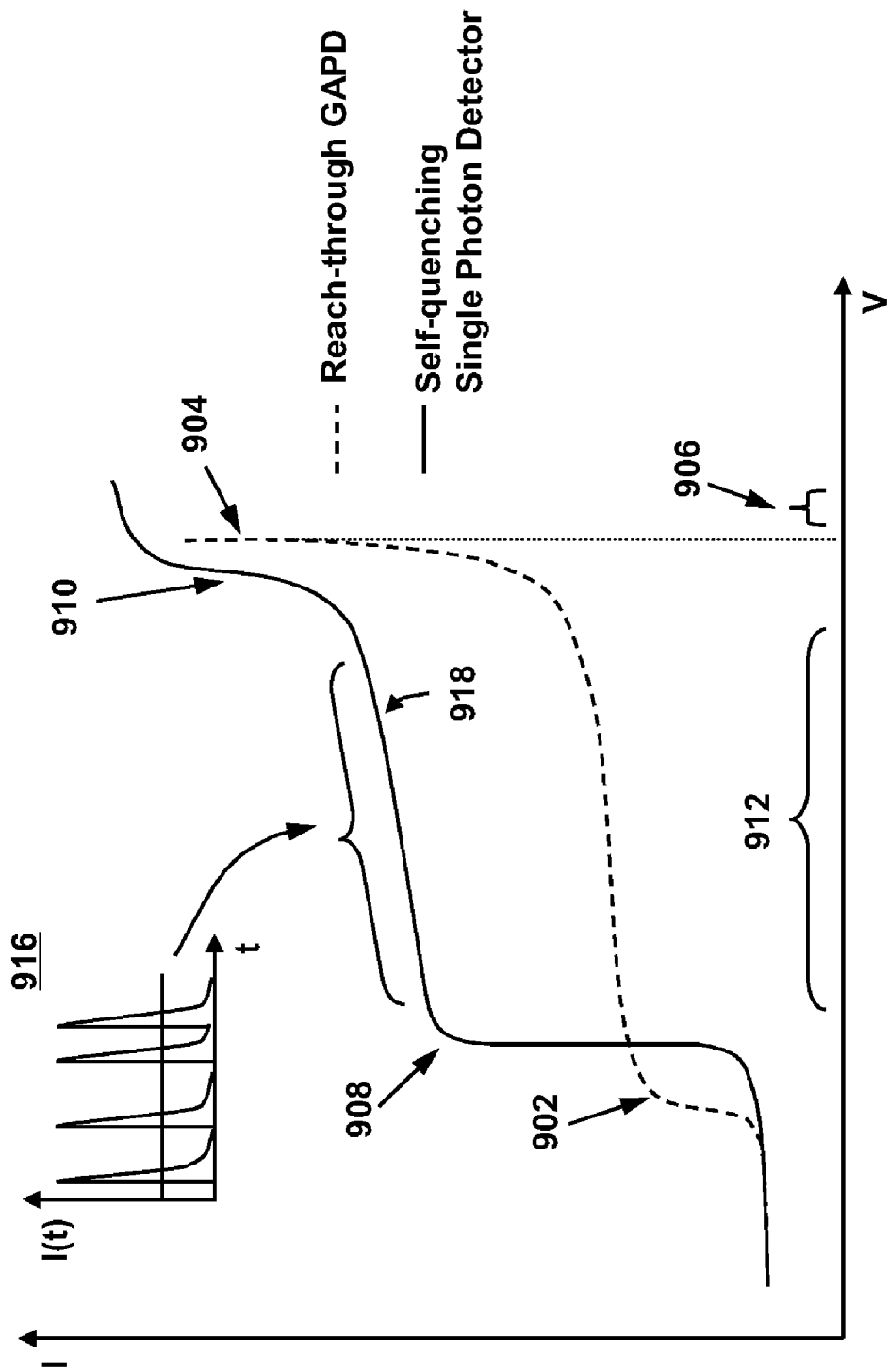
FIG. 9 shows an exemplary I-V curve of the device of the first embodiment according to the present disclosure compared with the I-V curve of a GAPD with a prior art reach-through structure.

FIG. 9 shows an exemplary I-V curve of the self-quenching single photon detector according to the present disclosure (solid line) compared with the I-V curve of a GAPD with a prior art reach-through structure (dashed line). The curve of the reach-through GAPD first attains a status of "reach-through", indicated by a small plateau 902, and then gradually develops into breakdown 904. The small bias range 906 above the breakdown voltage is the applicable bias range for Geiger mode operation.

Although the curve of the self-quenching single photon detector according to the present disclosure has a similar shape, its mechanism is different from that of a reach-through GAPD. The first rising region 908 of the self-quenching single photon detector curve indicates establishment of breakdown status in the multiplication region (see regions 508, 608 and 808 of respective FIGS. 5, 6 and 9). The second rising region 910 represents breakdown in the absorption region (see region 522 of FIG. 5). The large bias range 912 between the two raising segments 908, 910 is a working bias range of the self-quenching single photon detector. Because of the balanced interactions between the avalanche and self-quenching processes, the average voltage dropped across the multiplication region will be kept virtually constant. The excess voltage will drop across the absorption region and hence deplete it as the bias goes up from the first breakdown. Also shown in FIG. 9 are a pulsed current 916 which represents the transient current passing through the detector and the apparent DC current 918, which is an average of the transient pulsed current 916. Transient current 916 peaks as a photoelectron-triggered avalanche occurs in the multiplication region and goes down to a floor as the avalanche event is quenched by a self-quenching process.

Figure 10:
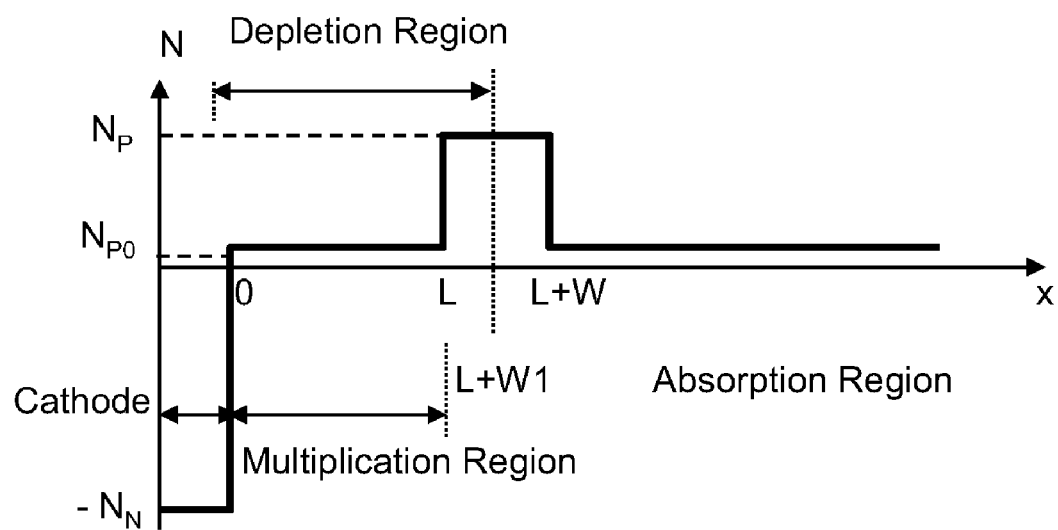
FIG. 10 shows doping concentration of a device according to the present disclosure as a function of the distance from the cathode or anode.

FIG. 10 shows a doping profile general for either an embodiment of the present disclosure or a traditional reach-through structure of a GAPD, where the positive and negative values along the N coordinates represent p-type and n-type doping concentrations, respectively, and the x values along the horizontal axis represent distance (e.g., vertical distance) from the cathode or anode.

In the particular situation of this disclosure, in accordance with the representation of FIG. 10, the multiplication region goes from distance 0 to distance L, while the quenching structure goes from distance L to distance L+W. In the quenching structure, the depleted portion goes from L to L+W1, while the undepleted portion goes from L+W1 to L+W. On the other hand, in the particular situation of a GAPD, the multiplication region goes from distance 0 to distance L, while the reach-through structure goes from distance L to distance L+W.

The following comments and equations will explain the conditions under which, in accordance with the present disclosure, depletion does not occur along the entire length W of the quenching structure but only along a distance W1<W of the quenching structure.

Should the quenching structure be depleted to a distance L+W1 due to a bias applied, according to the Poisson Equation, the field strength E and potential V in the depletion region can be expressed as:

$$E(x) = \frac{e^2}{\varepsilon_0 \varepsilon_{Si}} \int_x^{L+W1} N(x)\,dx \quad (1)$$

and $$V(x) = \int_x^{L+W1} E(x)\,dx \quad (2)$$

where e is the electron charge, and $\varepsilon_0$ and $\varepsilon_{Si}$ are the vacuum and semiconductor permittivities, respectively.

In a simplified situation, where $N_{P0}=0$, the field and potential in the X<L region can be expressed as $$E(x<L) = \frac{e^2 N_P W1}{\varepsilon_0 \varepsilon_{Si}} \quad (3)$$

and $$V(x<L) = \frac{e^2 N_P W1}{\varepsilon_0 \varepsilon_{Si}}\left(L - x + \frac{W1}{2}\right) \quad (4)$$

Equation (3) shows that the field in the multiplication region will become a constant in the simplified situation. In the particular situation of a GAPD, where the depletion region reaches to the far edge of the p-type doping structure, which is known as "reach through" status, Equation (3) turns into $$E = \frac{e^2 N_P W}{\varepsilon_0 \varepsilon_{Si}} \quad (5)$$

There is an electrical field $E_{MAX}$ in each semiconductor beyond which breakdown will occur due to avalanche or sustainable carrier multiplication. In silicon, $E_{MAX}$ is around $10^6$ V/cm.

In a traditional reach-through avalanche photodiode, the depletion region has to "reach through" the p-type doping structure and deeply penetrate into the absorption region for the purpose of photoelectron collection before occurrence of the avalanche or breakdown in the multiplication region. Therefore, in a reach-through APD, breakdown or avalanche must not occur earlier. Therefore, a reach-through APD must have $$N_P W < \frac{\varepsilon_0 \varepsilon_{Si} E_{MAX}}{e^2} \quad (6)$$

This means that the doping amount ($N_P W$) of a reach-through APD should be well controlled to be below its critical value regulated by $E_{MAX}$.

On the other hand, in accordance with the present disclosure, breakdown or avalanche is desired to occur in the multiplication region at a low voltage at a moment when the depletion region has not yet attained the far edge of the p-type doping structure. Hence, the doping amount of the p-type doping structure should be selected so that $$N_P W > \frac{\varepsilon_0 \varepsilon_{Si} E_{MAX}}{e^2} \quad (7)$$

In a more general situation where $N_{P0}$ can't be omitted, the device according to the present disclosure can be designed by selecting the doping or doping conditions so that breakdown occurs in the multiplication region before the depletion region reaches the far edge (L+W) of the quenching structure.

For example, a more general condition to be respected by devices according to the present disclosure can be summarized as $$E_{MAX} < \frac{e^2}{\varepsilon_0 \varepsilon_{Si}} \int_0^{L+W} N(x)\,dx \quad (8)$$

The term "doping" or "doping conditions" generally indicate doping parameters such as width and doping concentration. In some situations, there may be some other parameters (e.g., substrate background doping $N_{P0}$) that also influence the position of the depletion boundary.

According to an embodiment of the present disclosure, the quenching structures can have a doping concentration of $(1\text{-}2)\times 10^{18}/cm^3$ and a width of 0.1-0.3 μm. By contrast, a reach-through structure may have a doping concentration of $1\times 10^{17}/cm^3$ or below and a width of 0.1-0.2 μm.

The foregoing Detailed Description of exemplary and preferred embodiments is presented for purposes of illustration and disclosure in accordance with the requirements of the law. It is not intended to be exhaustive nor to limit the invention to the precise form or forms described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom.

This disclosure has been made with respect to the current state of the art, but also contemplates advancements and that adaptations in the future may take into consideration of those advancements, namely in accordance with the then current state of the art. It is intended that the scope of the invention be defined by the Claims as written and equivalents as applicable.

Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the method or process step, or steps, are expressly recited using the phrase "comprising step(s) for . . . ."

The invention claimed is:

1. A photoelectronic device comprising:
   a nanoscale doped semiconductor cathode or anode receiving, during operation of the photoelectronic device, multiplied electrons or holes;
   an undoped or unintentionally doped nanoscale semiconductor multiplication region connected with the cathode or anode, the multiplication region hosting carrier avalanche and carrier self-quenching during operation of the device; and a nanoscale doped semiconductor quenching structure connected with the multiplication region, the quenching structure comprising a depletion region that undergoes depletion during operation of the device and an undepletion region that remains undepleted during operation of the device.

2. The device of claim 1, further comprising a nanoscale cathode or anode contact to provide ohmic contact to the nanoscale cathode or anode.

3. The device of claim 2, wherein the nanoscale cathode or anode contact has a thickness in a 50-200 nm range.

4. The device of claim 2, wherein the nanoscale cathode or anode contact is an amorphous or polycrystalline semiconductor layer.

5. The device of claim 2, wherein the quenching structure has a thickness in a 100-500 nm range.

6. The device of claim 2, assembled in a pillar structure.

7. The device of claim 6, wherein the pillar structure is a horizontal or vertical pillar structure.

8. The device of claim 6, wherein the pillar structure has a length in a 300-1,500 nm range and a diameter in a 1-2,000 nm range.

9. The device of claim 1, wherein the nanoscale cathode or anode has a thickness in a 50-200 nm range.

10. The device of claim 1, wherein the multiplication region has a thickness in a 100-500 nm range.

11. The device of claim 1, wherein, during operation of the device, the multiplication region enters breakdown at a voltage of 10V.

12. The device of claim 1, wherein the nanoscale doped semiconductor cathode or anode is doped with a first type of dopant and the nanoscale doped semiconductor quenching structure is doped with a second type of dopant.

13. The device of claim 1, wherein the undepletion region of the quenching structure acts as a potential well to retard movement of carriers generated during avalanche during operation of the device, thus also quenching the avalanche.

14. The device of claim 6, further comprising a floating cathode or anode arranged on a shoulder region of the pillar structure.

15. The device of claim 1, further comprising a photoelectron absorption region connected with the quenching structure, the device acting, during operation, as a photon detector.

16. The device of claim 1, further comprising a doped semiconductor contact associated with the quenching structure, the contact serving as an inlet for carriers coming from other devices, the device acting, during operation, as a single carrier multiplier.

17. An avalanche and self-quenching process for a photoelectronic device, comprising:
providing a nanoscale multiplication region and a nanoscale quenching region connected with the nanoscale multiplication region, the nanoscale quenching region comprising a depletion layer that undergoes depletion during the avalanche self-quenching process, and an undepletion layer that remains undepleted during the avalanche self-quenching process; and
injecting a photoelectron or a photogenerated hole into the nanoscale multiplication region, whereby avalanche is initiated upon the injecting and pairs of free carriers are generated as a result of carrier multiplication, wherein
space charge initially contributed by the depletion layer of the nanoscale quenching region is modulated as multiplied carriers of one type move through the nanoscale quenching structure,
and electrical field in the multiplication region is reduced as a result of the modulation, thus quenching the avalanche.

18. The process of claim 17, wherein during avalanche and before quenching the carriers flow across the quenching region towards an anode or a cathode.

19. A photoelectronic device comprising:
a nanoscale doped semiconductor cathode or anode receiving, during operation of the photoelectronic device, multiplied electrons or holes;
an undoped or unintentionally doped nanoscale semiconductor multiplication region connected with the cathode or anode, the multiplication region hosting carrier avalanche and carrier self-quenching during operation of the device; and
a nanoscale doped semiconductor quenching structure connected with and contacted with the multiplication region, the quenching structure comprising a depletion region that undergoes depletion during operation of the device and an undepletion region that remains undepleted during operation of the device.

20. The device of claim 19, wherein the undepletion region of the quenching structure acts as a potential well to retard movement of carriers generated during avalanche during operation of the device, thus also quenching the avalanche.

* * * * *